US005773870A

United States Patent [19]

Su et al.

[11] Patent Number: 5,773,870
[45] Date of Patent: Jun. 30, 1998

[54] MEMBRANE TYPE INTEGRATED INDUCTOR AND THE PROCESS THEREOF

[75] Inventors: Shyang Su; Jeng Tzong Sheu, both of Hsinchu; Kuen Joung Chuang, Peng Hu, all of Taiwan

[73] Assignee: National Science Council, Taipei, Taiwan

[21] Appl. No.: 709,827

[22] Filed: Sep. 10, 1996

[51] Int. Cl.[6] .................................................. H01L 29/00
[52] U.S. Cl. ........................... 257/531; 336/65; 336/223; 336/232
[58] Field of Search .............................. 257/531; 336/65, 336/223, 232

[56] References Cited

U.S. PATENT DOCUMENTS 5,539,241   7/1996   Abidi et al. .............................. 257/531

Primary Examiner—Ngân V. Ngô

Attorney, Agent, or Firm—Beveridge, DeGrandi, Weilacher & Young,LLP

[57] ABSTRACT

A membrane type integrated inductor includes an integrated inductor laid out on the upper plane of a membrane. The process to manufacture a membrane type integrated inductor includes the following steps: forming a thin dielectric layer at the outer portion of a substrate; forming a wire-wound integrated inductor thin dielectric layer with the known technique; defining an open window on the back of the substrate below the inductor through the backside etch; and forming a membrane type integrated inductor by using the thin dielectric layer on the silicon substrate as the etching stop. One embodiment uses silicon dioxide as the membrane layer. The low dielectric constant of $SiO_2$ may be used to lower the power loss during the lay out of the circuit parts, to effectively raise the induction value, to lower the parasitic capacitance, to increase the resonance frequency, to decrease the volume of the chip which the inductor utilized, and to raise the quality factor.

5 Claims, 17 Drawing Sheets

MEMBRANE TYPE INTEGRATED INDUCTOR AND THE PROCESS THEREOF

DETAILED DESCRIPTION OF THIS INVENTION

This invention relates to the structure and process of an integrated circuit, particularly to the structure and process of a membrane type integrated inductor. The lay out of the inductor on the membrane with the backside etch technique may improve the power loss caused by the dielectric substrate of the substrate of the conventional integrated inductor, lower the parasitic capacitance, simplify the manufacture process and heighten the productivity.

A suspended inductor proposed to lower the loss and increase the inductivity applies an ananisotropic V-groove etching, as is known in the prior art and an isotropic etching. With reference to FIG. 2A to FIG. 2E, a conventional manufacture process of the integrated inductor is applied to lay out an inductor 21 enclosed by $SiO_2$ on a substrate 20 as shown in FIG. 2A. Five open windows 211 to 215 are etched out on the front $SiO_2$ layer 21 by means of the photolithography as shown in FIG. 2B; a V-groove etching is applied to etch the front of the substrate into V-grooves 221 to 225 with the appropriate depth about 200 μm as shown in FIG. 2D; and an isotropic etching is applied to etch out a suspended inductor in such a way that the five grooves 211 to 215 are communicative with one another, the substrate below the position where the inductor locates forms a hollow groove and the bottom of the substrate is closed as shown in FIG. 2E. By means of this suspended structure, the effect of the parasitic capacitance is partially improved. However, for the process of the etch is more complicate and hard to control, the yield percentage will be lowered. And, the etch of the five windows 211 to 215 will bring about a problem that more volume of the substrate will be occupied.

In view of the above, one object of this invention is to provide a membrane type integrated inductor and the process thereof to obviate the defects of the conventional integrated inductor. The inductor of low loss and high quality factor may lower the parasitic capacitance, increase the resonance frequency, decrease the volume of the substrate required for the lay out of the inductor. For it is simple in process and easy in production, the yield percentage may be increased.

To achieve the above object, a membrane type integrated inductor and the process thereof of this invention is provided, wherein the membrane type integrated inductor comprises: a membrane dielectric layer on the upper plane of the substrate and an integrated inductor laid out on the membrane dielectric layer, while the process thereof comprises the following steps: forming a membrane dielectric layer on a substrate; an integrated inductor being laid out on the above membrane dielectric layer with the known manufacturing technique of integrated inductor; defining an open window on the backside of the substrate with photolithography and etching to the membrane dielectric layer below the inductor with a backside etch; and forming a membrane type integrated inductor.

BRIEF DESCRIPTION OF THE DRAWINGS

For the objects, features and advantages of this invention to be more apparent and understood, a preferred embodiment will be detailedly described in accompany with the drawing as follows.

DESCRIPTION OF REFERENCE MUMMERS

Figure 1A:
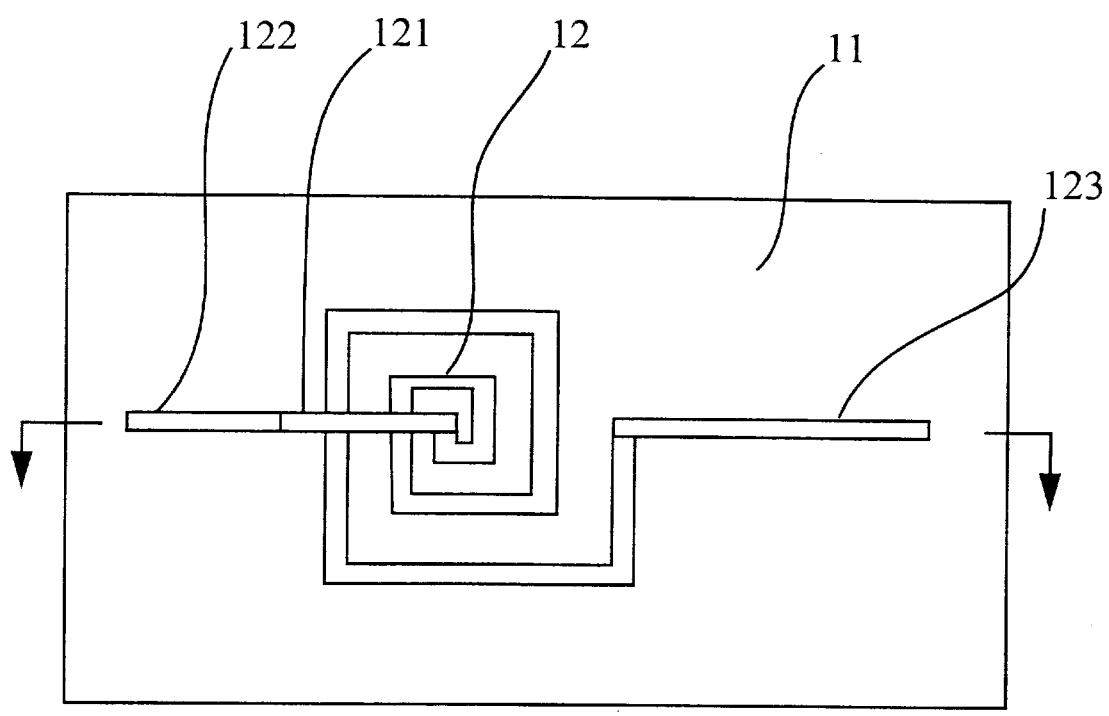
FIG. 1A is a top view schematically showing the structure of the conventional integrated inductor.
Figure 1B:
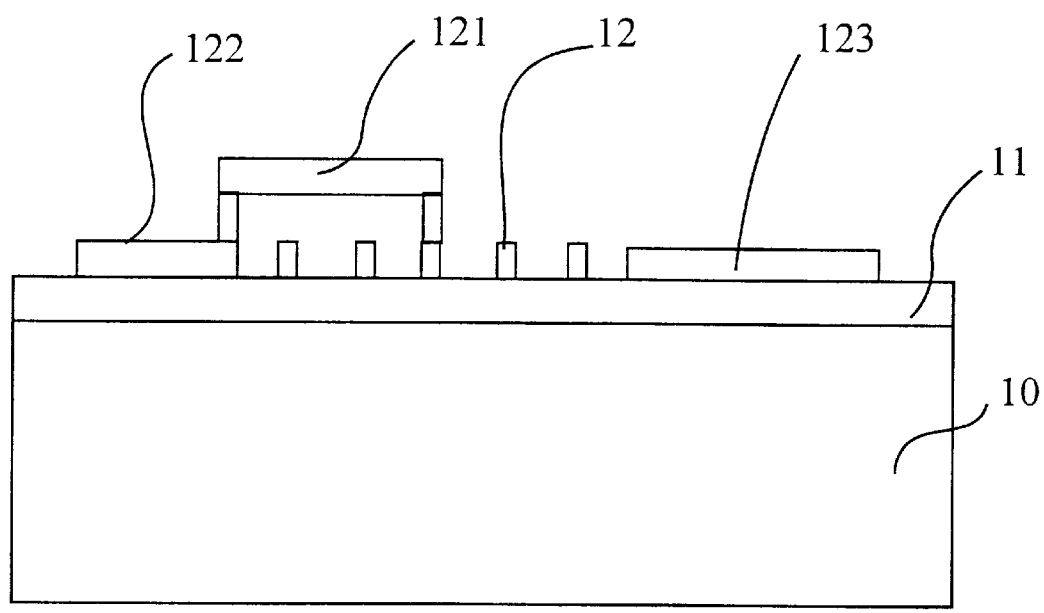
FIG. 1B is a sectional view showing the structure as shown in FIG. 1A.
Figure 2A:
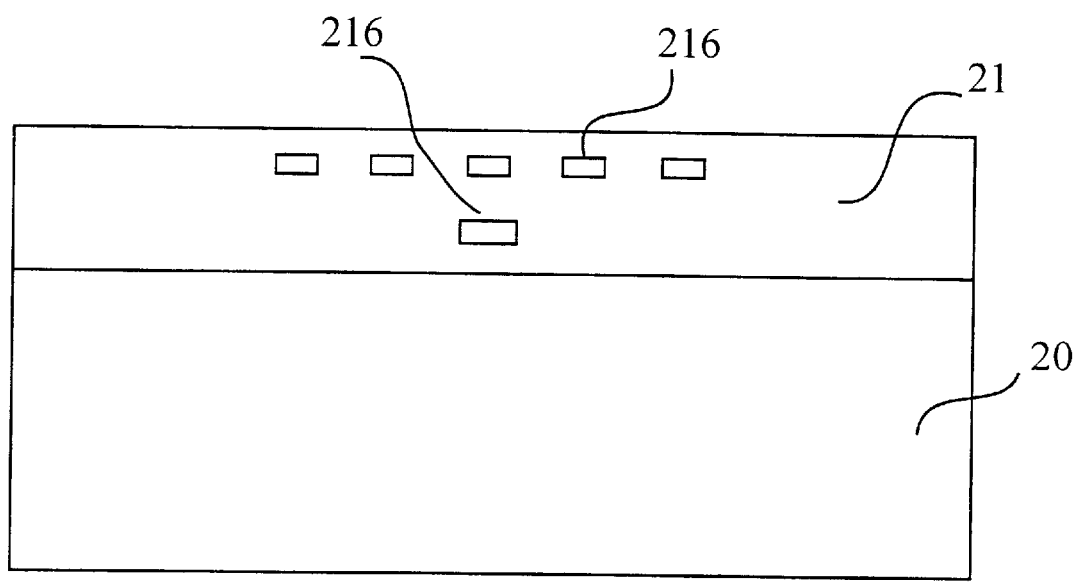
FIG. 2A is a sectional view schematically showing part of the process of a conventional integrated inductor.
Figure 2B:
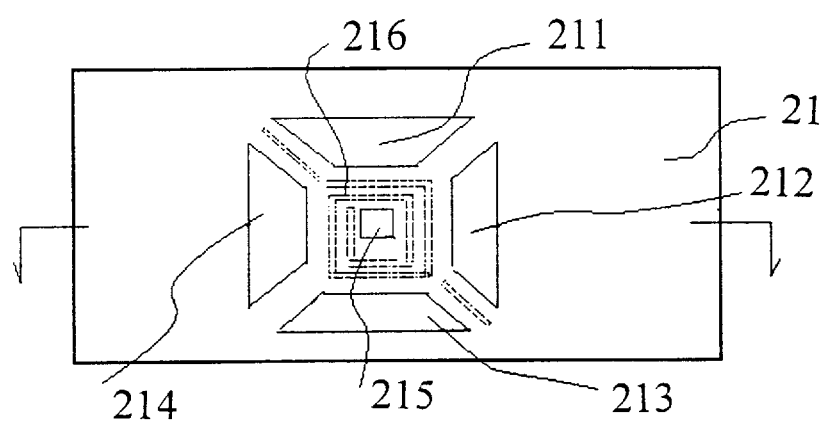
FIG. 2B is a top view schematically showing a part of the manufacturing process of the conventional suspended integrated inductor.
Figure 2C:
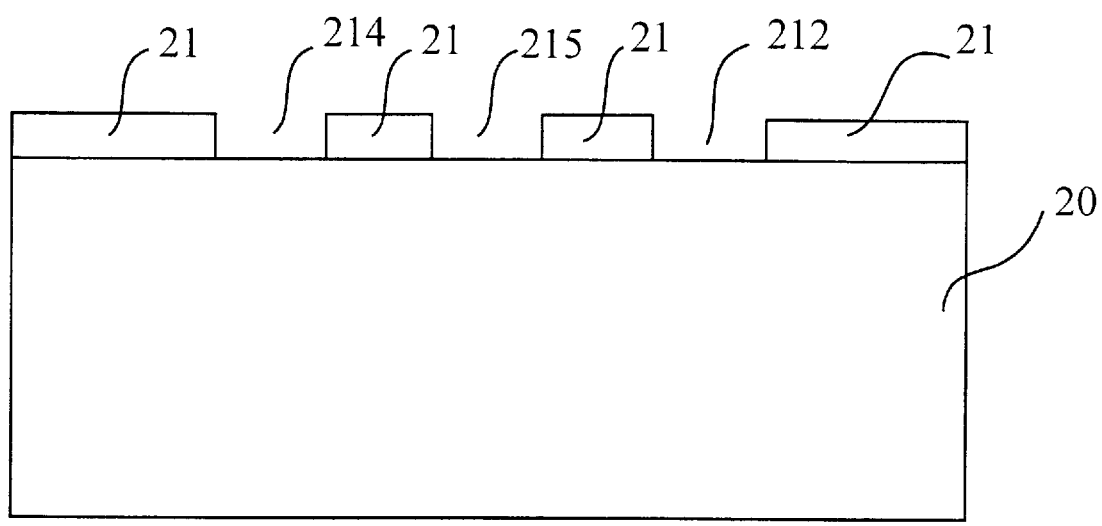
FIG. 2C is a sectional view showing a part of the sectional structure as shown in FIG. 2B.
Figure 2D:
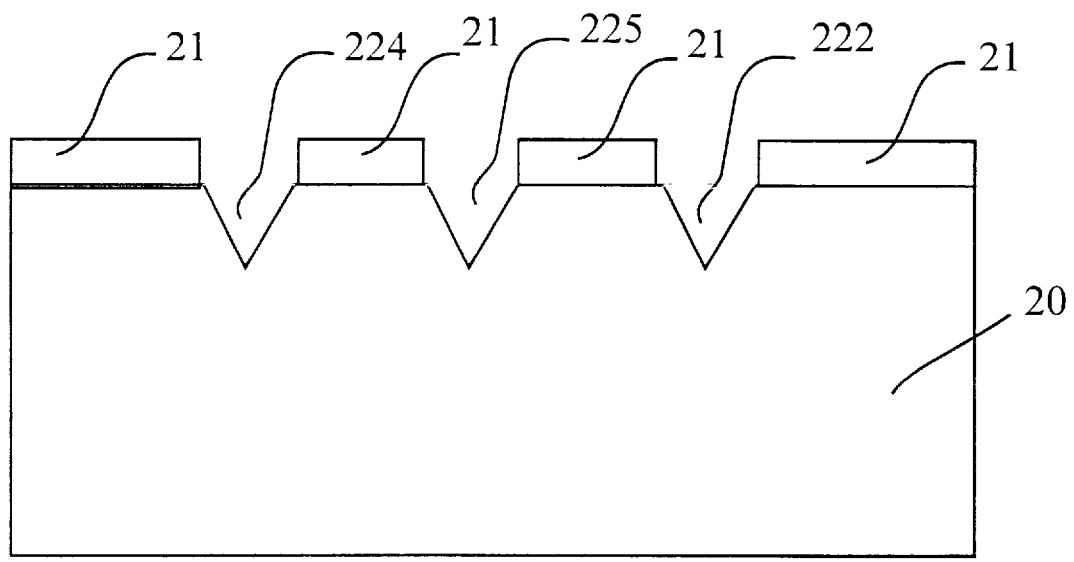
FIG. 2D and FIG. 2E are sectional views schematically showing a part of the manufacturing process of the conventional integrated in ductor.
Figure 2E:
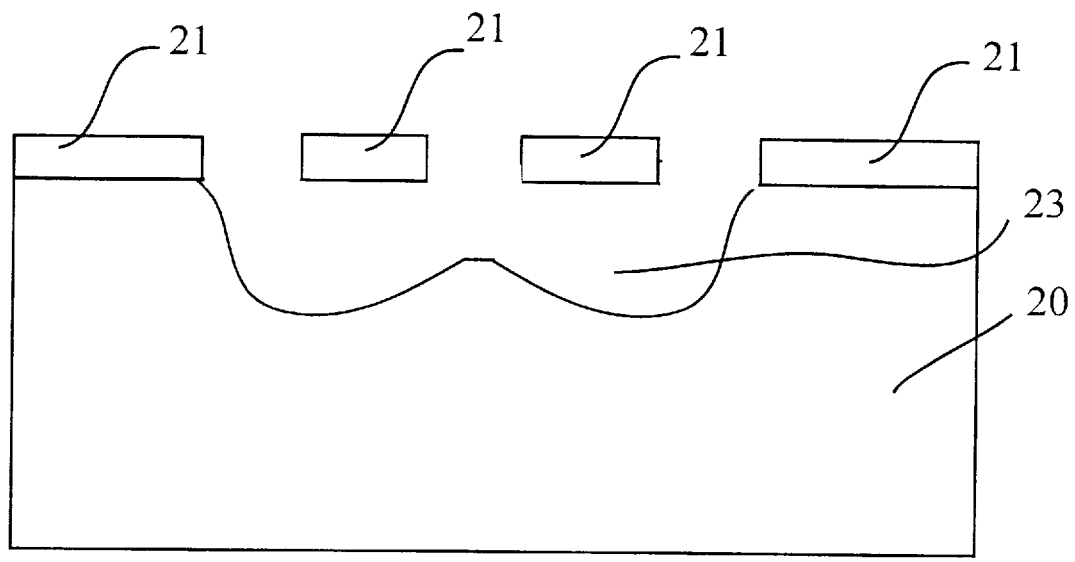

10 . . . substrate
11 . . . insulating layer
12 . . . conventional air bridge integrated inductor
121 . . . air bridge line
122, 123 . . . microstrip line
20 . . . substrate
21 . . . Conventional encase integrated inductor
211 to 215 . . . etched open windows
216 . . . wound conductor of the integrated inductor
221 to 225 . . . five V-grooveas
23 . . . hollow groove
30 . . . substrate
31 . . . membrane dielectric layer
32 . . . Conventional air bridge integrated line
321 . . . air bridge line
322, 323 . . . microstrip line
}

33 ... the etched open window on the backside of the substrate
34 ... the membrane dielectric layer below the inductor
40 ... substrate
41 ... compound membrane dielectric layer
411, 412 ... membrane $SiO_2$ layer
42 ... conventional air bridge integrated line
421 ... air bridge line
422, 423 ... microstrip line
43 ... the etched open window on the backside of the substrate
44 ... compound membrane dielectric layer below the inductor preferred embodiment (1)

Figure 3A:
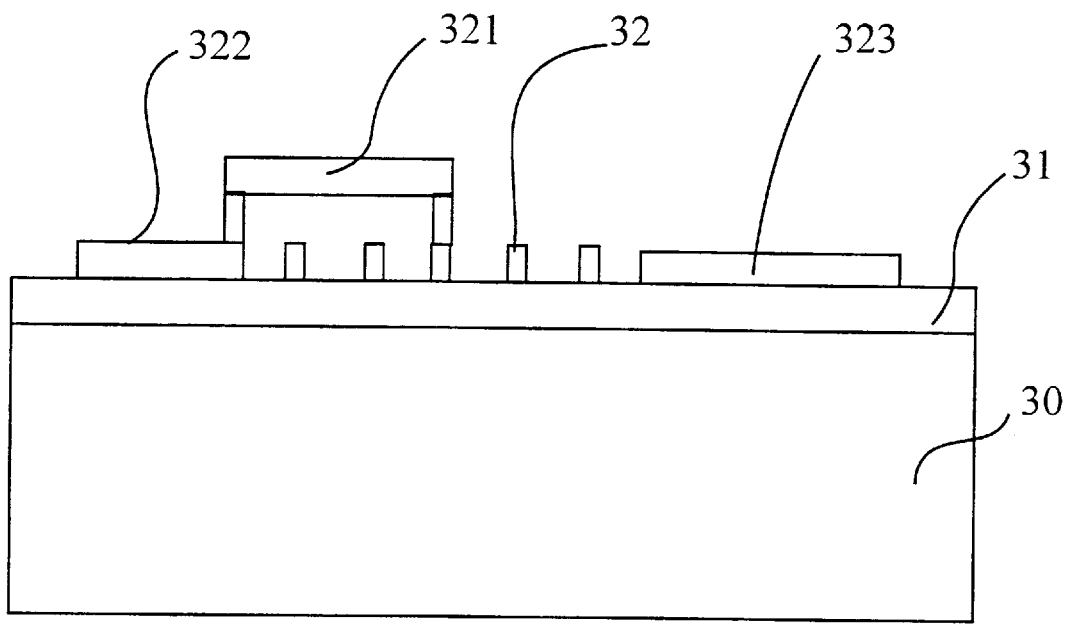
FIG. 3A is a sectional view schematically showing a part of the manufacturing process of a preferred embodiment (1) according to this invention.
Figure 3B:
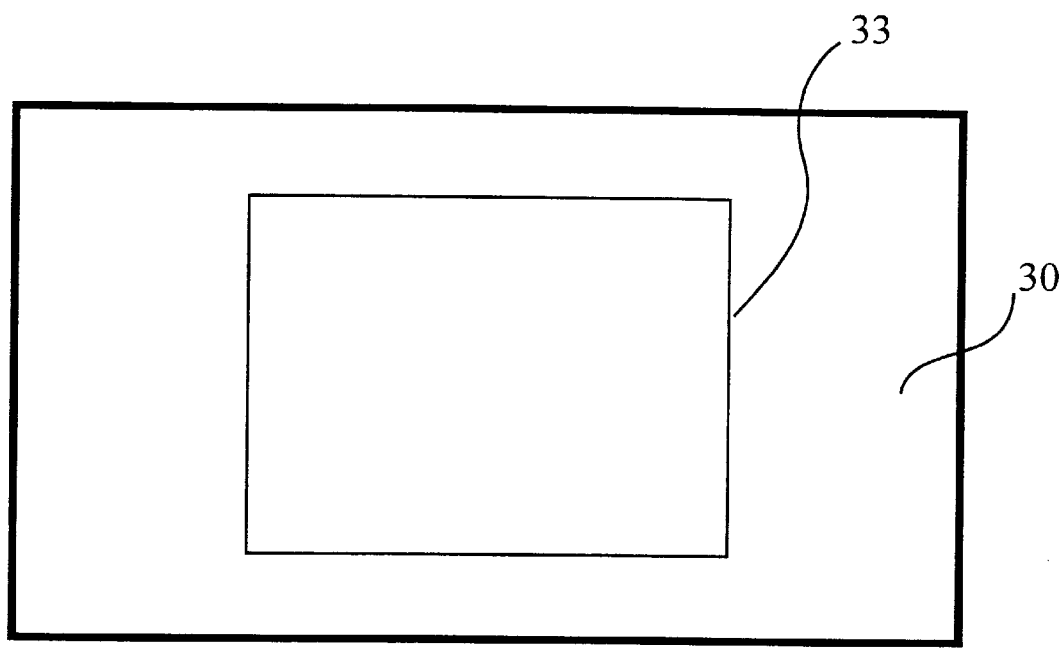
FIG. 3B is a top sectional view schematically showing a part of the manufacturing process of a preferred embodiment (1) according to this invention.
Figure 3C:
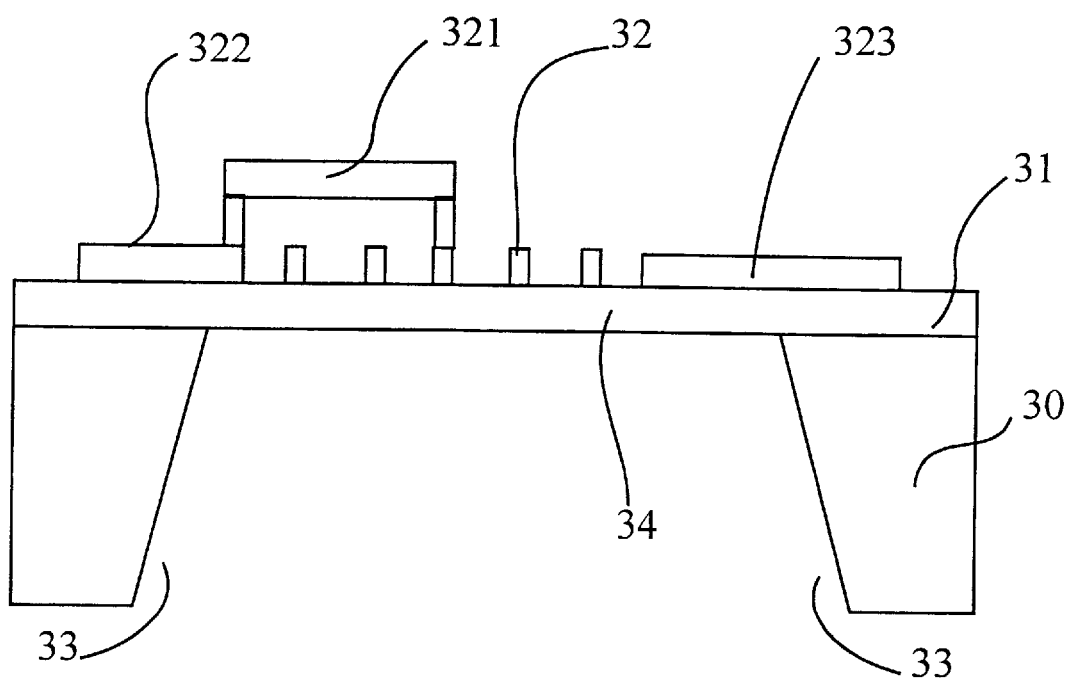
FIG. 3C is a sectional view schematically showing a part of the manufacturing process of a preferred embodiment (1) according to this invention.
Figure 3D:
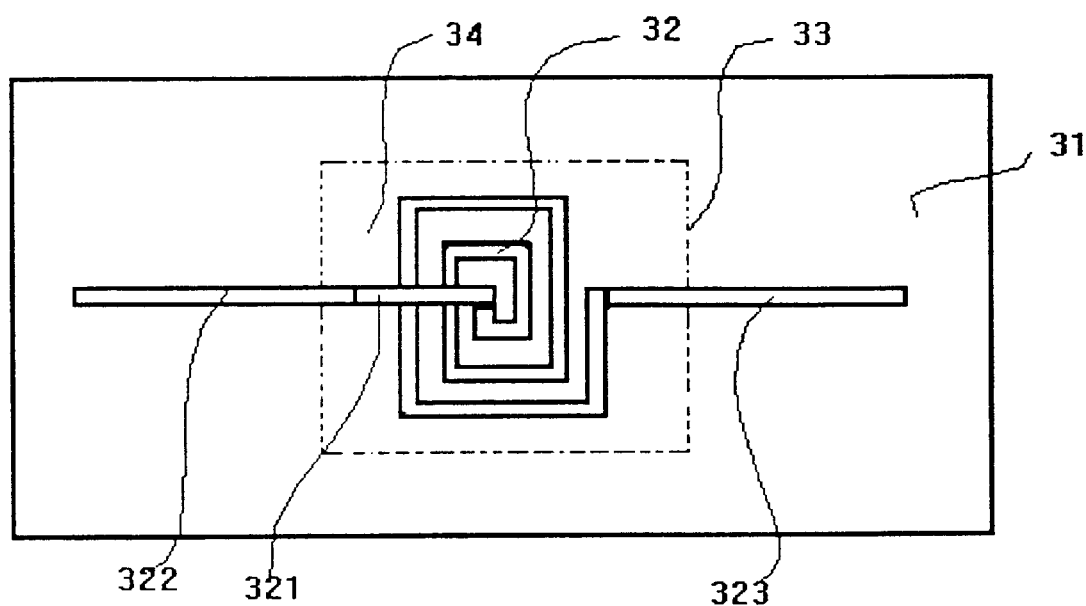
FIG. 3D is a top sectional view schematically showing a preferred embodiment (1) of a membrane type integrated inductor of this invention wherein the dotted line indicates the etched open window defined by the backside etch of the substrate.
Figure 3E:
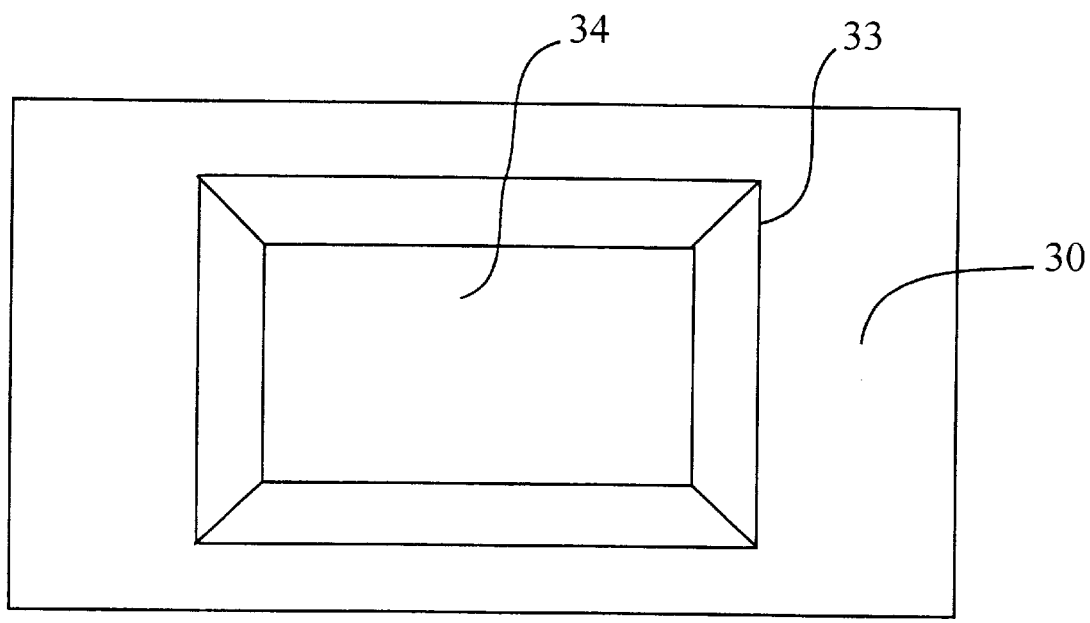
FIG. 3E is a bottom view schematically showing a preferred embodiment (1) of a membrane type integrated inductor according to this invention.

As shown in FIG. 3A, a membrane dielectric layer is formed on a silicon substrate 30. In this embodiment, a CVD or thermal oxidation is applied to form on the silicon substrate an oxide menbrane dielectric layer 31 having a thickness of which is from 0.5 $\mu$m to 20 $\mu$m and is preferably from 1 $\mu$m to 3 $\mu$m. An integrated inductor 32 is laid on the oxide membrane dielectric layer 31 by means of the conventional process of the integrated inductor. Further as shown in FIG. 3B, a photolithography technique using an infrared aligner or a double sided aligner to align and expose to define an etched area 33. The membrane layer 31 is used as etching stop to proceed an anisotropic backside etch. For example, KOH is applied to etch the substrate 30. In this way, a preferred embodiment of the process according to this invention is accomplished to obtain a membrane type integrated inductor as shown in FIG. 3C.

preferred embodiment (2)

Figure 4A:
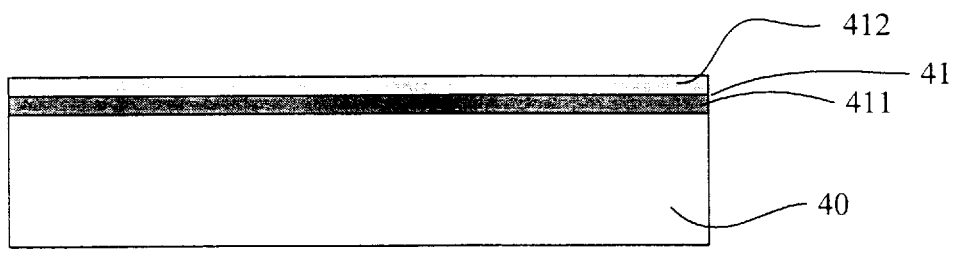
FIG. 4A is a sectional view showing part of the manufacturing process of another preferred embodiment (2) of this invention.
Figure 4B:
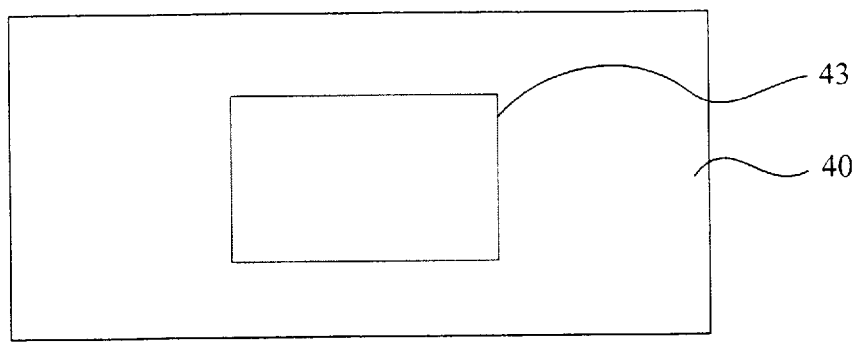
FIG. 4B is a top sectional view showing a part of the manufacturing process of another preferred embodiment (2) of this invention.
Figure 4C:
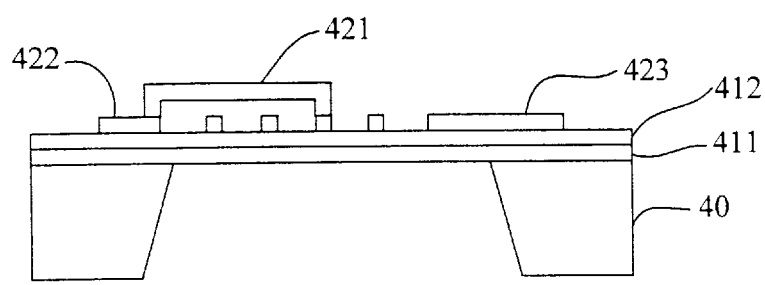
FIG. 4C is a sectional view showing a part of the manufacturing process of another preferred embodiment (2) of this invention.
Figure 4D:
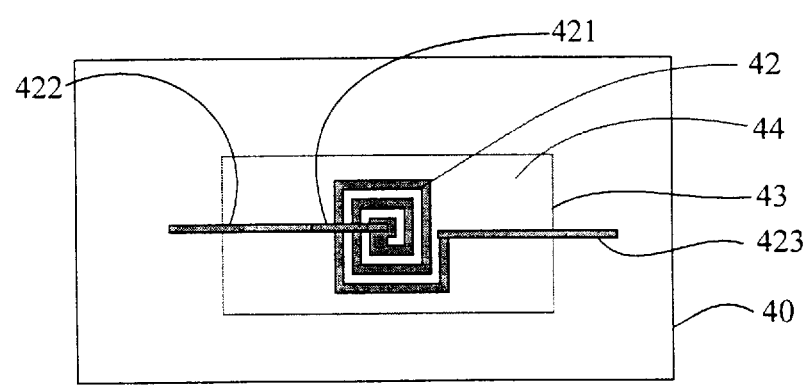
FIG. 4D is a top sectional view showing another preferred embodiment (2) of a membrane type integrated inductor of this invention wherein the dotted line indicates the etched open window defined by the backside etch of the substrate.
Figure 4E:
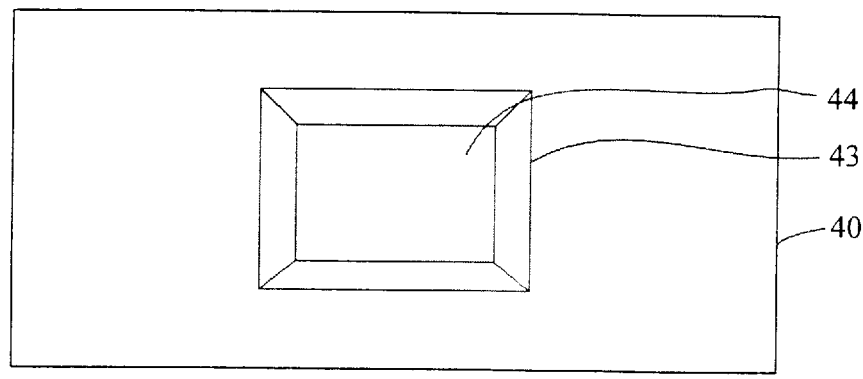
FIG. 4E is a bottom view showing another embodiment (2) of a membrane type integrated inductor according to this invention.

As shown in FIG. 4A, a membrane dielectric layer is formed on silicon substrate 40. In this embodiment, a CVD or thermal oxidation is applied to from on the silicon substrate 40 an silicon dioxide membrane layer 11 having a thickness of which is from 0.5 $\mu$m to 20 $\mu$m. Then, a PECVD or LPCVD is applied to or on the silicon dioxide layer 411 a silicon nitride layer 412 the thickness of which is from 0.5 $\mu$m to 20 $\mu$m. The silicon dioxde layer 411 and the silicon nitride layer 412 form a compound membrane dielectric layer 41. A conventional manufacturing process of a integrated inductor is applied to lay out an integrated inductor 42 on the compound membrane dielectric layer 41. Further with reference to FIG. 4B, a photolithography for example an infrared aligner or double sided aligner is utilized in aligning and exposing to define the etched area 43. The membrane layer 41 is used as an etching stop to proceed an anisotropic backside etch. For example, KOH is applied to etch the substrate 40. In this way, a preferred embodiment (2) according to this invention is accomplished to obtain a membrane type integrated inductor as shown in FIG. 4C.

Thus, the membrane type integrated inductor formed by way of the backside etching may substantially lower the power loss, and avoid the high parasitic capacitancy. Meantime, the use of simple backside etch renders the process easy to control and helpful to heighten the yield percentage. In comparison with the conventional suspended inductor, this invention without the need to etch out five open windows on the front face effectively decreases the required volume for the layout of the inductor and the magnetic line through the conductive silicon substrate, and lower the loss. Therefore, it satisfies what the present VLSI field requires to decrease the volume which the parts occupy.

The preferred embodiments as disclosed above are not to limit this invention. For example, the membrane may be made by the use of other materials such as SiC, diamond, quasi-diamond, poly silicon, single crystal silicon, GaAs etc. Any change made by those persons skilled in this art without, deviation from the spirit arid scope of this invention is deemed as covered by the accompanied claims.

What is claimed is:

1. A membrane type integrated inductor comprising:
   a substrate having a top surface,
   a membrane dielectric layer fabricated on the entire top surface of the substrate, and
   an integrated inductor formed on the membrane dielectric layer,;
   wherein the substrate below the membrane where the integrated inductor is formed is etched away using the membrane dielectric layer as an etching stop.

2. A membrane type integrated as claimed in claim 1 wherein the membrane dielectric layer is silicon dioxide, silicon nitride, silicon carbide, diamond, quasi diamond, poly silicon, single silicon crystal, or gallium arsenide.

3. A membrane type integrated inductor as claimed in claim 1 wherein the thickness of the membrane dielectric layer is from 0.5 $\mu$m to 20 $\mu$m.

4. A membrane type integrated inductor as claimed in claim 1 wherein the membrane dielectric layer is a compound layer formed by a plurality of different dielectric layers.

5. A membrane type integrated inductor as claimed in claim 1 wherein the substrate is silicon, gallium arsenide or aluminiuml oxide.

* * * * *